United States Patent [19]

Kiec et al.

[11] Patent Number: 5,134,248
[45] Date of Patent: Jul. 28, 1992

[54] THIN FILM FLEXIBLE ELECTRICAL CONNECTOR

[75] Inventors: Thomas M. Kiec, Spring; Dennis W. Livengood, Cypress; Arthur P. Haag, Houston, all of Tex.

[73] Assignee: Advanced Temperature Devices, Inc., Cypress, Tex.

[21] Appl. No.: 611,831

[22] Filed: Nov. 13, 1990

Related U.S. Application Data

[62] Division of Ser. No. 568,445, Aug. 15, 1990.

[51] Int. Cl.⁵ .................... H01R 4/02; H01R 43/02
[52] U.S. Cl. ........................ 174/84 R; 29/860; 29/869; 29/879; 439/67; 439/77
[58] Field of Search ............ 174/84 R, 94 R; 29/860, 29/869, 879; 439/67, 68, 77

[56] References Cited

U.S. PATENT DOCUMENTS

| | | | |
|---|---|---|---|
| 2,488,622 | 11/1949 | Giorgianni | 177/311 |
| 2,573,686 | 11/1951 | Blinn | 73/365 |
| 3,044,050 | 7/1962 | Abromaitis | 340/227 |
| 3,144,629 | 8/1964 | Curby | 338/28 |
| 3,158,713 | 11/1964 | Margulies | 200/87 |
| 3,210,751 | 10/1965 | Shiraishi | 340/256 |
| 3,297,846 | 1/1967 | Peltier | 200/142 |
| 3,367,175 | 2/1968 | Morreal | 73/86 |
| 3,386,282 | 6/1968 | Jacobson | 73/88.5 |
| 3,403,558 | 10/1968 | Elliott | 73/362 |
| 3,426,217 | 2/1969 | Womble | 307/231 |
| 3,510,762 | 4/1970 | Lesli | 324/52 |
| 3,516,082 | 6/1970 | Cooper | 340/227.1 |
| 3,575,053 | 4/1971 | Telinde | 338/25 |
| 3,595,228 | 7/1971 | Simon | 128/145.5 |
| 3,643,245 | 12/1972 | Jones | 340/228 |
| 3,720,900 | 3/1973 | Von Bruning | 338/25 |
| 3,813,662 | 4/1974 | Lewis | 340/213 |
| 3,864,825 | 2/1975 | Holmes | 338/308 X |
| 3,866,158 | 2/1975 | Reber | 338/25 |
| 3,896,284 | 7/1975 | Holmes | 338/308 X |
| 3,898,641 | 8/1975 | Banner | 340/280 |
| 3,955,068 | 4/1976 | Shaheen | 219/549 |
| 4,036,786 | 7/1977 | Tiedemann | 252/511 |
| 4,050,052 | 9/1977 | Reichelt | 338/308 |
| 4,139,833 | 2/1979 | Kirsch | 338/308 |
| 4,146,957 | 4/1979 | Toenshoff | 29/612 |
| 4,164,607 | 8/1979 | Thiel et al. | 428/621 |
| 4,204,935 | 5/1980 | Klesse et al. | 338/308 X |
| 4,227,039 | 10/1980 | Shibasaki et al. | 338/308 X |
| 4,228,425 | 10/1980 | Cooke | 340/550 |
| 4,236,146 | 11/1980 | Clark | 340/517 |
| 4,263,589 | 4/1981 | Lewiner | 340/638 |
| 4,296,633 | 10/1981 | Hakansson | 73/362 |
| 4,356,478 | 10/1982 | Muggli | 340/593 |
| 4,375,056 | 2/1983 | Baxter | 338/25 |
| 4,388,267 | 6/1983 | Tokarz | 376/247 |
| 4,408,904 | 10/1983 | Tokarz | 374/137 |
| 4,504,522 | 3/1985 | Kaiser | 427/103 |
| 4,520,352 | 4/1985 | Domingue | 340/590 |
| 4,586,246 | 4/1986 | Oskoui | 29/612 |
| 4,645,280 | 2/1987 | Gordon et al. | 439/77 |
| 4,737,757 | 4/1988 | Senda et al. | 338/308 |
| 4,780,790 | 10/1988 | Takimoto | 361/323 |
| 4,803,457 | 2/1989 | Chapel, Jr. et al. | 338/195 |
| 4,812,800 | 3/1989 | Fuchs | 338/2 |
| 4,827,218 | 4/1989 | Meunier | 324/252 |
| 4,916,808 | 4/1990 | Sanborn et al. | 29/847 |
| 4,920,635 | 5/1990 | Yajima et al. | 338/195 X |
| 4,929,923 | 5/1990 | Dharmadhikari | 338/308 |
| 4,963,699 | 10/1990 | Urushibata et al. | 174/94 R X |
| 4,978,814 | 12/1990 | Honour | 174/130 R |

FOREIGN PATENT DOCUMENTS

| | | |
|---|---|---|
| 128601 | 12/1984 | European Pat. Off. . |
| 2571493 | 10/1984 | France . |
| 53-144699 | 12/1978 | Japan . |
| 310101 | 12/1988 | Japan ............................. 338/22 R |

Primary Examiner—Morris H. Nimmo
Attorney, Agent, or Firm—Arnold, White & Durkee

[57] ABSTRACT

Apparatus and method for making electrical contact with a thin conductive film comprising, in one embodiment, a base with a thin conductive strip and a flexible substrate affixed to the base such that the strip and the substrate abut and form a substantially planar surface. An electrical lead is affixed to the conductive strip and a thin conductive film is applied to the planar surface such that it covers at least a portion of the conductive strip.

7 Claims, 8 Drawing Sheets

FIG. 3

| ANGSTROMS | MACBETH OPTICAL DENSITY | PERCENT TRANSMISSION | OHMS RESISTANCE (OHMS/SQ.) |
|---|---|---|---|
| | .00 | 100.00 | .00 |
| | .10 | 79.43 | |
| | .20 | 63.10 | |
| | .30 | 50.12 | |
| | .40 | 39.81 | |
| | .50 | 31.62 | |
| | .60 | 25.12 | |
| | .70 | 19.95 | |
| | .80 | 15.85 | |
| | .90 | 12.59 | |
| 30.5 | 1.00 | 10.00 | 6.70 |
| 50.8 | 1.10 | 7.943 | 5.35 |
| 63.5 | 1.20 | 6.310 | 4.55 |
| 71.12 | 1.30 | 5.012 | 3.98 |
| 81.28 | 1.40 | 3.981 | 3.50 |
| 84. | 1.50 | 3.162 | 3.32 |
| 96.5 | 1.60 | 2.512 | 3.06 |
| 101.6 | 1.70 | 1.995 | 2.86 |
| 106.7 | 1.80 | 1.585 | 2.68 |
| 114.3 | 1.90 | 1.259 | 2.50 |
| 121.9 | 2.00 | 1.000 | 2.35 |
| 127. | 2.10 | .7943 | 2.2 |
| 134.6 | 2.20 | .6310 | 2.05 |
| 142.3 | 2.30 | .5012 | 1.93 |
| 154.9 | 2.40 | .3981 | 1.80 |
| 172.7 | 2.50 | .3162 | 1.66 |
| 188. | 2.60 | .2512 | 1.55 |
| 203. | 2.70 | .1995 | 1.42 |
| 218. | 2.80 | .1585 | 1.31 |
| 236. | 2.90 | .1259 | 1.23 |
| 254. | 3.00 | .1000 | 1.18 |
| 290. | 3.10 | .0794 | 1.12 |
| 292. | 3.20 | .0631 | .98 |
| 317. | 3.30 | .0501 | .90 |
| 343. | 3.40 | .0398 | .83 |
| 363. | 3.50 | .0316 | .78 |
| 394. | 3.60 | .0251 | .72 |
| 427. | 3.70 | .0199 | .66 |
| 457. | 3.80 | .0153 | .62 |
| 500. | 3.90 | .0126 | .58 |
| 508. | 4.00 | .0100 | .53 |

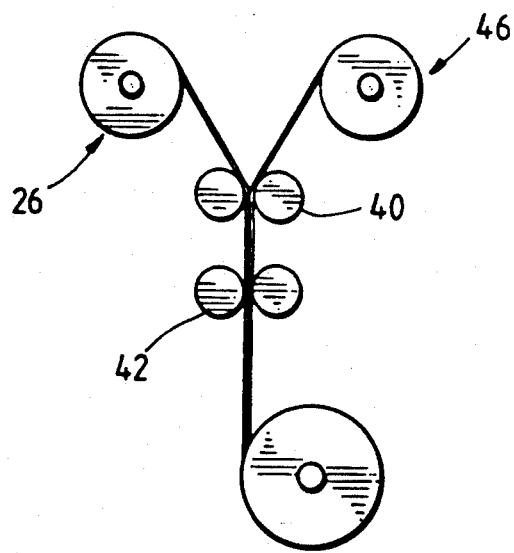
FIG.4
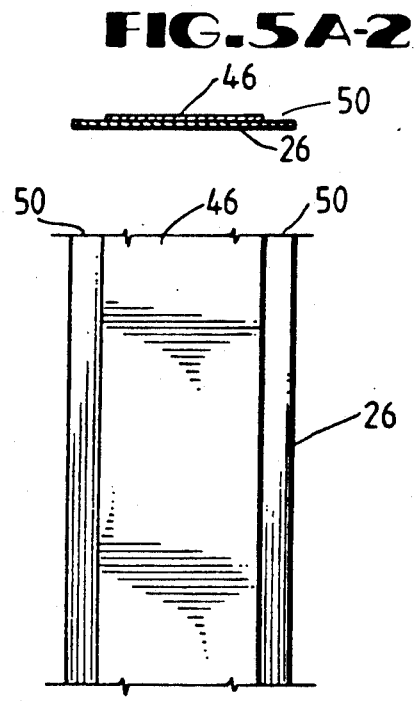
FIG.5A-2
FIG.5A-1
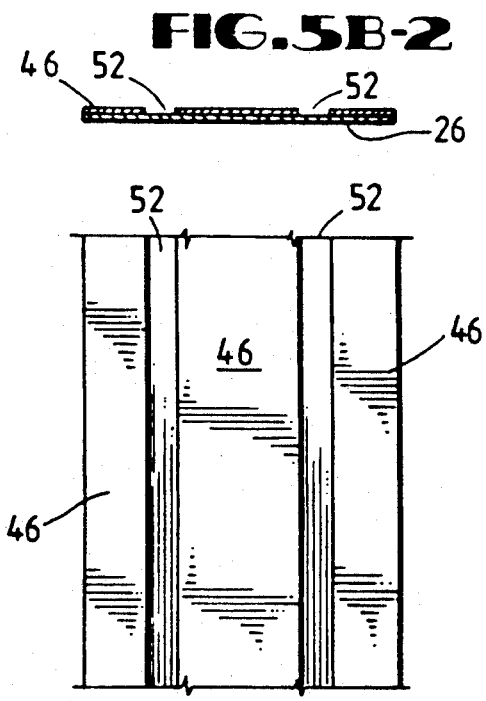
FIG.5B-2
FIG.5B-1
FIG.6A

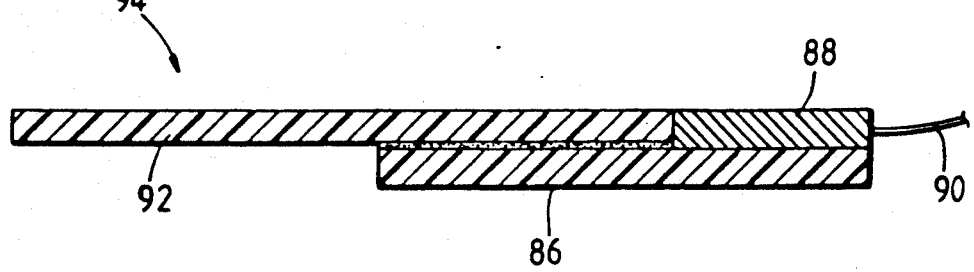
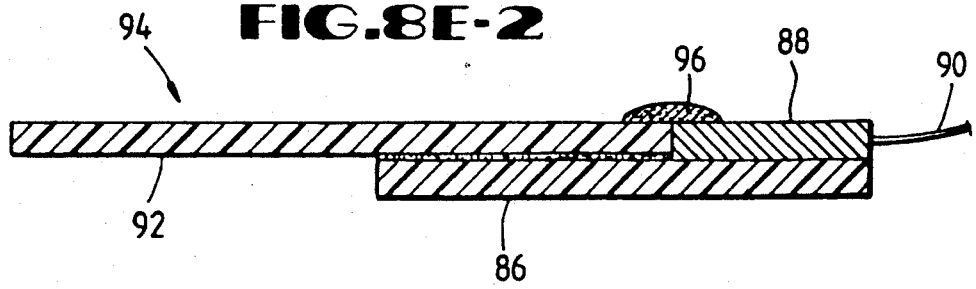
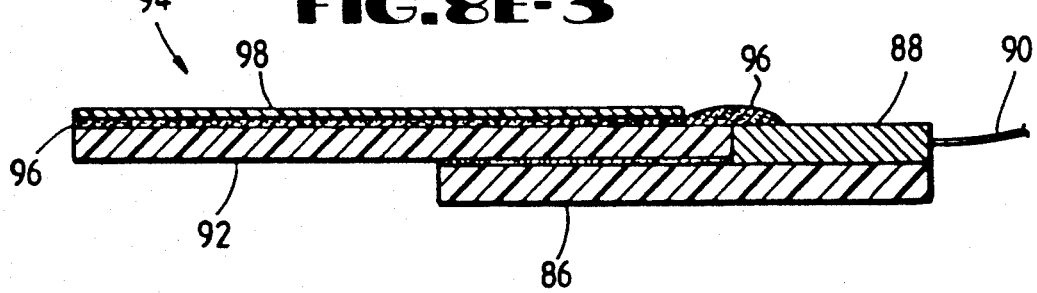

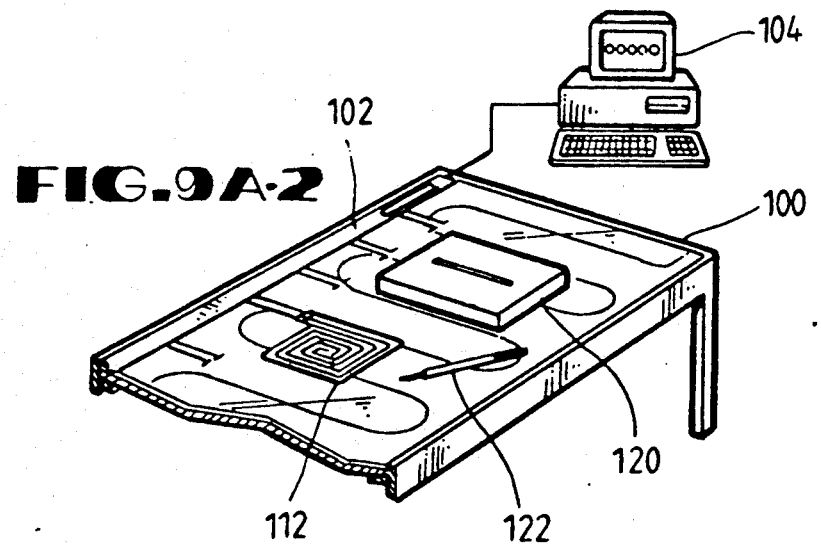
FIG.9A-2
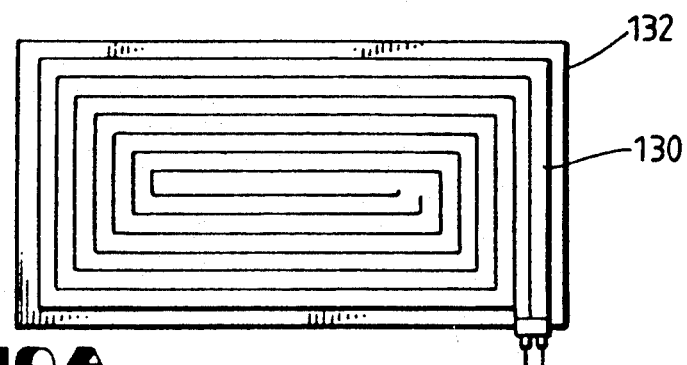
FIG.10A
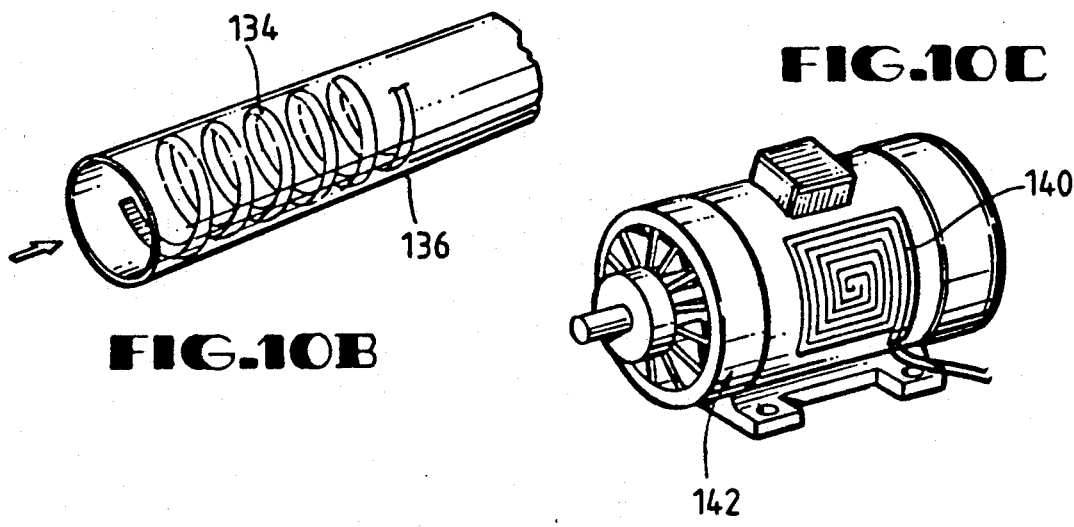
FIG.10B
FIG.10C

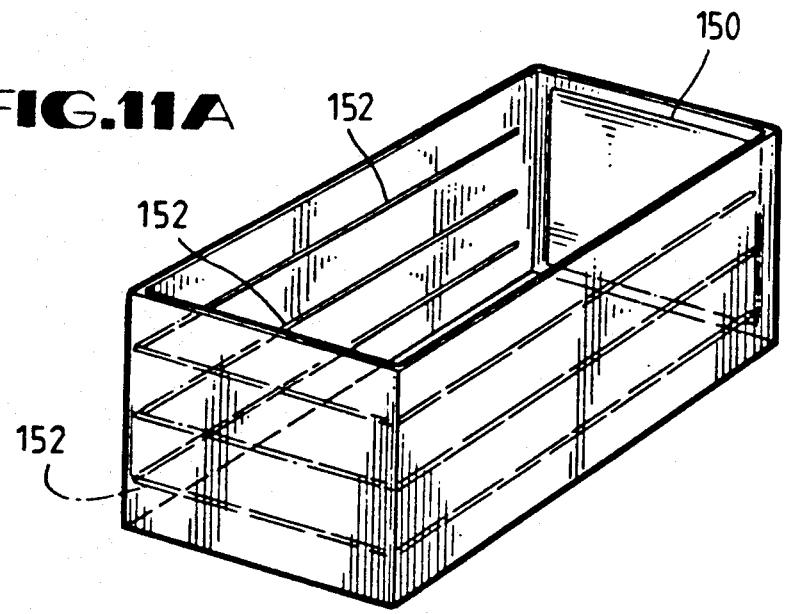
FIG.11A
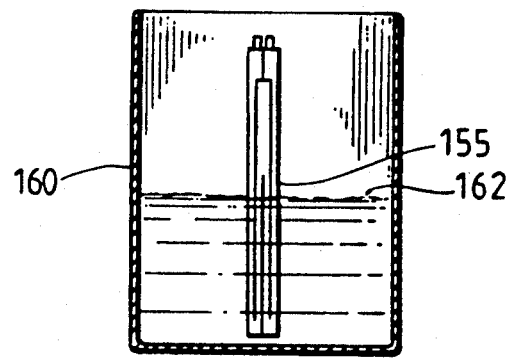
FIG.11B-1
$$L_? \propto \frac{KL}{R_1 - R_0}$$
FIG.11B-2
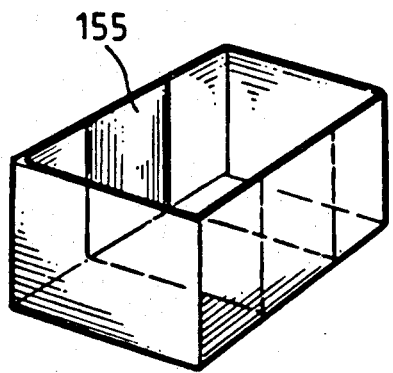
FIG.11C
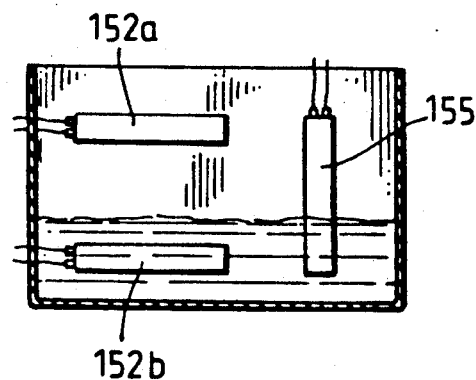
FIG.11D

THIN FILM FLEXIBLE ELECTRICAL CONNECTOR

This is a divisional application of pending prior U.S. application Ser. No. 07/568,445 filed on Aug. 15, 1990.

I. FIELD OF THE INVENTION

The present invention relates to thin film resistance temperature devices (RTD's), and more particularly to thin film RTD's comprising flexible organometallic composite.

II. BACKGROUND OF THE INVENTION

A resistance temperature device (RTD) is a device whose resistance varies according to its temperature. By measuring the resistance of a RTD at various temperatures, a Resistance vs. Temperature curve (RT curve) may be obtained for that RTD. Given the resistance of an RTD and its RT curve one can compute the temperature of that device.

One important value that may be obtained from an RT curve is a value known as alpha. Generally, alpha (sometimes referred to as the temperature coefficient of resistance (TCR)) represents the percent unit change in resistance per unit change in temperature (Ohms/Ohm/deg. C.). Graphically, the TCR at a given point represents the slope of the RT curve at that point.

While any device whose resistance varies with temperature may function as an RTD, there are several desirable features that improve an RTD's performance.

First, it is generally desired that the RTD's RT curve be substantially linear over the temperature range to be measured. As discussed above, the TCR corresponds to the slope of the RT curve. Thus, in order to have a substantially linear curve, the TCR of the RTD should be substantially constant over the desired temperature range.

This linearity is desired because, among other thing, it simplifies the development of electronic circuitry to convert the resistance of the RTD into an electrical signal which varies as a function of temperature and it enables the use of linear curve fitting techniques. Further, a substantially constant TCR is important for the precise measurement of temperature.

A second desirable feature of RTD's is that their RT curves be repeatable. This primarily means that the RT curve for a particular RTD be the same after every temperature cycle (or that the TCR of the RTD be substantially constant over time). For example, most RTD's expand or contract as the temperature changes. This expansion and contraction often causes the RT curve (i.e., the TCR) of a particular device to change over time. Thus, the RT curve of one specific RTD subject to several temperature fluctuation may be substantially different than it originally was. The RTD industry has established certain standards establishing the acceptable percent variability of the TCR for commercial RTDs. A change in the RT curve is undesirable because, among other things, the electrical circuitry used with the RTD is generally designed to operate with only one RT curve (i.e., one TCR).

Third, because of the wide range of applications in which RTD's are used, it is desirable that the RTD be durable and rugged. Temperature measurements must be made in many harsh environments, e.g., environments having harsh chemicals or strong vibrations, and it is desirable to have an RTD insensitive to such vibrations, chemicals and the like.

Fourth, it is generally desirable that the RTD respond rapidly to changes in temperature. In certain applications (e.g. fire detection, heat detection) it is important to detect the change in temperature almost immediately. Thus, a desired attribute of an RTD is rapid response to temperature changes.

Finally, it is generally desirable to have an RTD that can be easily and economically produced.

Prior art devices have been able to combine but a few of the above describe attributes in any one RTD. For example, the platinum wire RTD, developed by C. H. Myers in 1932, has a substantially constant TCR, is able to accurately measure temperature changes, but is fragile and often uneconomical. This device is produced by winding a helical coil of platinum wire on a crossed mica web, and mounting this assembly inside a glass tube. The winding of the wire on the web is necessary for a substantially constant and repeatable RT curve (i.e., the TCR is constant).

This particular arrangement, of an unsupported wire structure in a glass tube, is not very durable and is susceptible to strong vibrations. As such, the platinum wire RTD is not practicable for many applications. Further, the high cost of platinum renders the platinum wire RTD relatively expensive. Recent attempts have been made to increase the durability of platinum RTD's. According to the most recent construction techniques, a platinum or metal glass slurry is deposited onto a small flat ceramic substrate and sealed. One example of such a technique is provided by U.S. Pat. No. 4,139,833 to Kirsch. These ceramic based RTD's are more resistant to harsh environments than the platinum wire RTDs, but are often extremely brittle and rigid. Further, if the coefficient of thermal expansion of the ceramic substrate differs from that of the deposited metal or slurry, which it usually does, substantial changes in the RT curve may occur. These changes are a result of the stress and strain placed on the deposited material when the substrate and the material attempt to expand at different rates. In an attempt to avoid such a change in the RT curve, the substrate used in many prior art devices is selected such that it is substantially rigid (i.e., it does not expand or contract at operating temperatures).

In addition to ceramic based RTDs, prior art RTDs have used thin film devices as alternatives to the platinum wire RTD. U.S. Pat. No. 4,375,056 to Baxter et al. discloses a thin film RTD comprising a serpentine metal pattern deposited upon an insulating substrate. The deposited platinum is disclosed as being between the range of 0.05-0.8 microns, with depositions below 0.05 microns described as being too thin to be practically handled. As with the ceramic based RTDs discussed above, devices of the type disclosed in Baxter are susceptible to differences between the coefficient of thermal expansion of the deposition layer and the insulating substrate.

Each of the described prior art devices utilizes a thin (or thick) metal film deposited upon a rigid substrate. In order to prevent strain on the metal deposition, the substrate are generally selected such that they do not expand or contract at opening temperatures.

As discussed above, RTD's are based on the principle that certain materials exhibit a change in resistance for a change in temperature. In order to allow for accurate measurements of the resistance change, it is generally desirable for the RTD to exhibit a measurable degree of resistance. In the prior art metal is the material of choice for RTD's. Because most metals are fairly conductive, prior art devices generally follow one of two alternatives: first, prior art devices often utilize metals having a relatively high resistivity (e.g., platinum). Metals having low resistivity (i.e., metals that are highly conductive) such as gold, silver, and aluminum are rarely used.

Second, as opposed to using a metal with low conductivity, some prior art devices use a metal with moderate conductivity (e.g, copper). To compensate for the moderate resistance of copper, prior art device merely use more copper. Thus, while copper RTD's are often have TCRs similar to those of platinum, the length of the resistance element is substantially greater.

This focus on metals with low conductivity results in a dilemma for the prior art. The devices must either be made out of a metal having relatively low conductivity (e.g., platinum), resulting in high cost; or the devices must be made out of a metal having moderate conductivity (e.g., copper), requiring the use of a longer resistive element the often complex manufacturing processes associated with such lengthy elements. The use of highly conductive metals (e.g., gold, silver, aluminum) in RTDs was avoided in the prior art because of the size of the resistive elements that were believed to be necessary.

The prior art devices, while possessing many of the attributes of a desirable RTD, are not adapted for use in all possible applications. Specifically, the brittle nature of these prior art devices makes it difficult to conform the RTD to the shape of a particular object whose temperature is to be measured.

In contrast to the prior art, the present invention realizes all of the describes attributes desirable for a RTD. Further, the present invention provides an RTD that may be adapted to most all possible RTD applications.

It is a feature of the present invention to provide a RTD that has a substantially linear RT curve, has a substantially constant TCR, and is adaptable to operation in harsh environments. It is further feature of this invention to provide an RTD with a fast response time.

It is a still futher feature of this invention to provide an RTD which may be easily and economically produced using low cost, highly conductive metals.

Additional features of the present invention will be set forth in the description that follows, and may be learned by practice of the invention.

III. Summary of the Invention

To achieve the forgoing objectives, a flexible, low cost, durable, chemical resistant, vibration resistant, RTD is disclosed. This RTD includes an organometallic composite which exhibits a highly accurate, rapid, and repeatable positive response to temperature changes.

Of particular interest to the present invention are certain novel electrical connectors for making electrical contact with the thin conductive film attached to the RTD. These connectors generally comprise a base to which a conductive strip and an insulating substrate are attached such that the strip and the substrate form a substantially planar surface. An electrical lead is affixed to the conductive strip and a thin conductive film is attached to the substantially planar surface such that it covers at least a portion of the conductive strip. In this manner the electrical lead is coupled to the thin conductive film. Further discussion of an RTD to which the present invention relates may be found in the above-referenced application Ser. No. 07/568,445.

This calibrated device is a highly accurate, flexible RTD which has a TCR that is substantially constant over changes in time and temperature.

IV. Brief Description of the Drawings

FIG. 3 is a chart illustrating a general relationship between resistivity, percent transmission, and optical density for thin film metals;

FIG. 4 illustrates the application of a protective film to a metallized roll of thermoplastic;

FIGS. 5A-1, 5A-2, 5B-1 and 5B-2 illustrate alternate methods of applying the protective film to the metallized roll;

FIGS. 6A-6B illustrate geometric resistive patterns;

FIGS. 8A-8D, 8E-1, 8E-2 and 8E-3 illustrate various connectors between a thin metal film and an electrical lead;

FIGS. 9A-1, 9A-2, 9B-1 and 9B-2 illustrate one method for calibrating the RTD of the present invention;

FIGS. 10A-10C illustrate novel devices for temperature measurement;

FIGS. 11A, 11B-1, 11B-2, 11C and 11D illustrate a novel device for measuring fluid level and fluid temperature.

V. Description of Specific Embodiments

A. The Device

Figure 1:
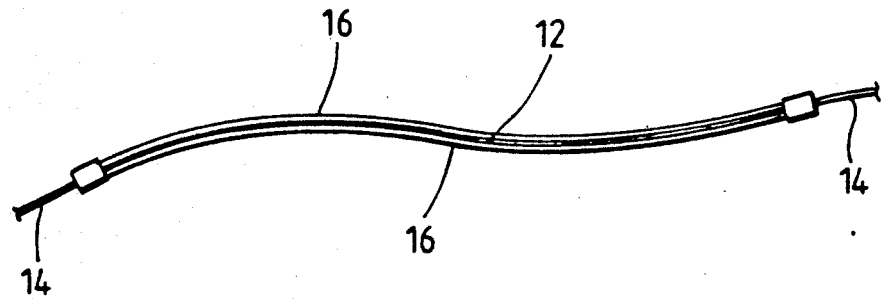
FIG. 1 illustrates a resistive temperature device of the present invention.

FIG. 1 illustrates a basic embodiment of the present invention. An RTD is illustrated as comprising a composite or "sandwich" of three layers.

A thin film of a conductive material such as metal 12 is bonded between a substrate and a barrier such as thermoplastic films 16a and 16b. Electrical leads 14 are connected to the metal film 12 according to one of the methods discussed below.

The metal layer 12 is preferably vacuum metallized aluminum, although aluminum, silver, gold, lead, copper, platinum, titanium, nickel, molybdenum, tungsten, rhodium, iridium, palladium, doped silicon, tin, zirconium, columbium, alloys including the foregoing, conductive pigments, and foils are believed acceptable. The thickness of the metal layer 12 depends in part on the overall size and characteristics desired for the RTD, but is generally within the range between a mono-atomic layer and about 2000 angstroms and frequently between about 250 and about 1000 angstroms (1 Angstrom=1×10-10 Meters).

Metal layer 12 may be attached to the thermoplastic sheet 16a via vacuum deposition, although others methods of attachment are envisioned. Currently, sputtering, chemical vapor deposition and the like are believed to be acceptable alternatives for attaching metal layer 12 to thermoplastic sheet 16a. Thermoplastic sheet 16b may be attached to metal layer 12 through the use of know adhesives.

A substrate, such as thermoplastic sheets 16a and 16b preferably comprise a thermoplastic polymer which is operable in the temperature range to be measured. For example, depending on the application, polyester has been found to be an acceptable polymer for temperatures between −200 C. and 200 C. Such thin sheets of polyester are commercially available under the tradename MYLAR available from DuPont, or other commercially available equivalents. For temperatures over 200 C. commercially available polymers such as KAPTON, UPILEX, TEFLON, or fluorocarbons or the like are believed to be acceptable. At the present time polymers such as polyethelyene, polypropalyene, nylon, polycarbonate, poly(4-methyl-1-pentene), polybutene-1, blended plastics and the like are believed to be acceptable substitutes for MYLAR and KAPTON. The polymers are believed to be acceptable substitutes for MYLAR for lower temperature applications, as well as some higher temperature application.

Generally, when selecting the materials of thermoplastic sheets 16a and 16b, it is important to consider the temperature range to be measured, and the polymer's ability to accept metallization. The ability of a thermoplastic polymer to accept metallization is believed to be related to the surface roughness of the particular polymer. Type A MYLAR has been found to be an acceptable thermoplastic for most applications. (MYLAR is a registered trademark of the E. I. duPont deNemours company of Wilmington, Del.)

The thickness of the thermoplastic sheets 16a and 16b may be determined by the response time desired for the RTD. Thicker sheets are envisioned when a slower response time is permissible or desired, or if increased environmental protection is desired.

Electrical leads 14 are connected to metal layer 12 and may be connected to known circuitry to measure the resistance between the leads. By measuring the resistance between the leads 14 for several temperatures, an RT curve for the RTD 10 may be obtained. Once the RT curve is obtained, the temperature of the device may be determined by measuring the resistance across leads 14.

B. Manufacture of the Device

The first step in making the RTD of the present invention is to determine the composition of the metal layer 12, and of the thermoplastic sheets 16a and 16b. As discussed above, aluminum has been found to be an acceptable metal for layer 12 although other possibilities are envisioned.

1. Selection of the Thermoplastic Polymer

The selection of sheets 16a and 16b involves the consideration of several factors. First, the thermoplastic film selected must be able to accept metallized films.

Second, the thermoplastic film selected must be able to operate at the temperatures the device will be measuring; this includes temperature spikes (temperature "spikes" are short duration rises (or declines) in the temperature. For example, if the RTD is to measure temperatures in an environment that averages approximately 150 C. but is subject to temperature spikes of over 200 C., a film capable of operating at greater than 200 C. must be selected. If the highest possible temperature is not considered in selecting the sheets the RTD may be destroyed each time a temperature spike occurs. As discussed above, MYLAR type A has been found acceptable for most applications.

Third, the particular thickness of the thermoplastic must be selected with the desired response time in mind. The thickness of the thermoplastic sheet is inversely related to the response time of the RTD. Generally, the thicker the thermoplastic sheet, the slower the response time. The needed thickness can be calculated given the desired response time and the thermal conductivity of a given thermoplastic material. This calculation can be accomplished through simple engineering techniques well known in the art.

For many applications in the lower temperature range requiring comparatively rapid response times, type A, 200 gauge MYLAR has been found acceptable.

Certain polymers are known to emit toxic vapors at high temperatures. Consequently, appropriate precautions may need to be made when selecting the thermoplastic material 16.

2. Selection of the Metal

As with the thermoplastic layers 16a and 16b, the selection of the metal material 12 involves many factors. First, as discussed above, it is generally desirable to have a RTD with a linear RT curve. As such, it is generally desirable to select a metal having a substantially constant TCR over the expected operating temperatures. Second, for economical reasons, the cost of the material and its strategic availability may be considered. The coefficients of thermal expansion (TCE) for the metal and the thermoplastic material should also be considered. Generally it is desirable to have the coefficients of thermal expansion of the metal and the thermoplastic sufficiently close to avoid problems from strain such as altered temperature coefficients of resistance. For example, a film of aluminum (having a TCE of about 26 microinches per inches per degree Celsius) on a substrate of MYLAR (having a TCE of about 17 microinches per inch per degree Celsius) has been found to be acceptable. Other considerations should be: (1) the thickness of the conductive film and the current load, (2) possible Seebeck effects arising from use of dissimilar metals at an interconnect, and (3) the temperature range at which the device will operate.

Using type A MYLAR, aluminum has been found to be an acceptable metal for most applications, although it is believed that any conductive metal meeting the above criteria will suffice.

C. Attaching the Metal to the Thermoplastic Material

1. Vacuum Deposition

Figure 2:
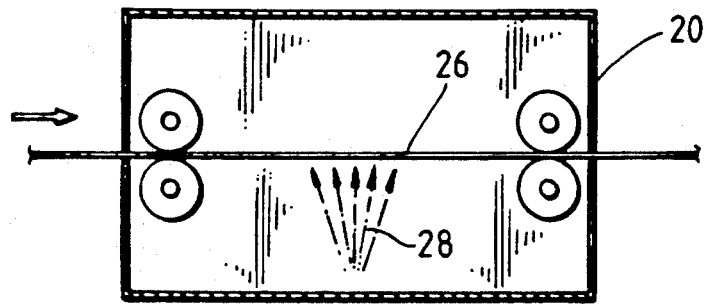
FIG. 2 illustrates one method for applying metal film to a thermoplastic polymer.

Once the metal 12 and the thermoplastic material 16 is selected, metal 12 may be vacuum deposited on a first roll of thermoplastic material 16. Vacuum deposition procedures are well known in the art and will not be discussed herein in great detail. FIG. 2 show a vacuum deposition chamber 20. A roll of the selected thermoplastic polymer 26 is positioned within the chamber. The selected metal 28 is then deposited onto the sheet 26.

The size of roll 26 depends on the application for which the RTD is being manufactured. For example, for small RTD's a roll width of 1 inch will suffice; for larger RTD's sizes up to the standard 60 inch roll may be necessary. Generally any roll size may be used because the size of the roll is not believed to affect the performance of this invention. However, for certain deposition techniques, the size of the roll may affect the uniformity and consistency of the deposition.

The deposition thickness of the metal is an important feature of this invention. For aluminum, the metal 28 should be deposited on the sheet until its depth is in the desired range.

Although not fully understood at this time, the depth of the deposition plays an important role in allowing the RTD of the present invention to yield a repeatable and substantially linear RT curve. The TCR and resistance values of the metal film on the thermoplastic are presently believed to be substantially different from those obtained when the same metal film is deposited on a different substrate (e.g., a polished glass or ceramic substrate).

As discussed above, the RTD of the present invention exhibits a substantially linear RTD curve that is not affected or degraded by numerous temperature cycles. This is believed to be a result of a special interaction between the deposited metal and the resin surface of the thermoplastic polymer. This special interaction between the metal and the polymer is believed to be closely related to the deposition thickness of the metal. For example, when aluminum deposition depths of greater than about 2000 angstroms are used, it is believed that the effects of the metal layer 12 dominate those of the thermoplastic sheets 16a and 16b. As such, any RTD produced in such a process would exhibit substantially the same qualities as a thick metal film on a substrate other than the polymer.

At aluminum deposition depths of lower than about 250 angstroms, the effect of the metal on the RTD begin to diminish and the RTD begins to operate as would unmetallized sheets of thermoplastic material.

As disclosed in this application, for aluminum, the region approximately between 250–1000 angstrom allows the RTD to exhibit several unique characteristics, i.e., substantial linearity and repeatability. The mechanisms causing the linear RT curve and the high repeatability for this region are not yet fully understood but are believed to involve the interaction of the thin metal layer and the relatively rough surface of the thermoplastic sheet.

The resistances of thin films on thermoplastic sheets has been found by the inventors to be slightly higher than would be expected. This is believed to be result from the coarseness of the thermoplastic film, having small, microscopic peaks and valleys, imparting a uniform reduction in the electron flow of the thin film deposited metal. This reduction on electron flow is believed to result from the interferences of the non-conducting resin of which the thermoplastic is made with the continuity of the metallic deposit. The effect of this interaction may be labeled the "cornfield effect" as the resistance provided by the roughness of the resin surface may be likened to the resistance to air flow that exists over a cornfield as opposed to a flat open area.

The following disclosure discusses the use of aluminum of type A MYLAR. For this metal/thermoplastic combination a deposition thickness of 250–1000 angstroms has been found to exhibit this "cornfield effect" and render the improved RTD of this invention. It will be understood that those of ordinary skill having the benefit of this disclosure will be able to find other metal/thermoplastic combinations which are acceptable for use in the present invention. The depth of the metal deposition for these combinations may change depending on the surface characteristics of the selected thermoplastic. It is understood that these combinations are within the scope of the present invention.

2. Deposition Variables

In order to ensure that several RTD's may be made having similar qualities it is desirable to have some way of measuring the level of deposition. This may be done using any number of known methods. For example, FIG. 3 contains a chart illustrating three variables that may be assigned to a sheet that has received a metal deposition (a metallized film). The chart shows that for aluminum, the optical density, percent transmission and resistance (ohms per square unit of area) may be used to describe any given metallized film. This chart is merely representative of several available in the prior art.

It is important to note that the relationship between resistivity, percent transmission, and optical density is not always as show in FIG. 3. As such, it is generally desirable to use only one variable when defining metallized sheets for the present invention. The resistivity (ohms/square) has been found acceptable, although the other variables may be used. Depositions to yield resistivity between about 0.5 ohms/square to about 1.5 ohms/square are believed to be satisfactory. Aluminum deposition thickness between approximately 250–2000 angstroms are also believed to be satisfactory.

Techniques for depositing a metal on a thermoplastic film given a desired resistivity (ohms/square) are well known in the art and will not be discussed here.

3. Alternatives to Vacuum Deposition

Vacuum deposition is not the only way that the metal can be attached to the thermoplastic material. Other techniques, such as metallization, lamination, pressure sensitization, thermal curing, printing, electrodeposition techniques, chemical vapor deposition, vacuum deposition, sputtering, glow discharge, radiation curing (e.g., ultraviolet curing), printing techniques, plasma deposition, thermal evaporation, E-beam evaporation, and the like are believed to be viable. What is important when using alternate techniques is that, for aluminum, the layer of metal have a thickness generally within the above described limit, i.e., approximately 250–1000 angstroms.

4. Alternate Embodiments

Prior to the application of the metal to the thermoplastic material, a coating or coatings to reduce the effects of heat aging may be applied to the thermoplastic.

D. Application of a Protective Coating

After the metal layer is deposited on the first roll 26 of thermoplastic, a second roll 46 is applied as a protective cover. This process is illustrated in FIG. 4.

As FIG. 4 shows, a second roll 46 is provided. This second roll 46 may be made of the same thermoplastic material as the first roll 26. Further, the second roll 46 may have a adhesive precoated on one side. when the adhesive is precoated on the second roll 46, it may be attached to the first via pressure from rollers 40 and 42. This second roll of thermoplastic is necessary to protect the metal layer from scratching, erosion and corrosion.

1. Attachment of Thermoplastic Polymer

In alternate embodiments the second roll of thermoplastic does not cover all of the metallized surface of the first roll. These embodiments are illustrated in FIGS. 5A-1, 5A-2, 5B-1 and 5B-2. As FIGS. 5A-1 and 5A-2 illustrate the second roll 46 may cover all but the edges of the metallized surface of the first roll 26. The exposed region 50 may be used to make connections to the metal layer to allow for the attachments of electrical leads 14 as illustrated in FIG. 1.

Referring to FIGS. 5B-1 and 5B-2 an embodiment is illustrated where the second layer of thermoplastic 46 covers all but two strips of the metallized surface of the first roll 26. The two exposed surfaces are labeled as 52. As with the embodiment in FIG. 5A, the exposed surfaces may be used to make connections to the metallized surface of roll 26.

While the geometry of the second, protective layer may be of any shape, it is generally beneficial to leave regions close to the center of the roll exposed for connections. The reason for this is that vacuum deposition, while creating an essentially uniform surface, tends to deposit a more uniform layer of metal at the center of the roll. Further, the thickness of the metal at the center is sometimes greater than that at the edges. This slight difference in thickness and uniformity becomes significant when deposition thicknesses in the region of this invention are used.

2. Protective Barriers

Alternate embodiments are envisioned where the second roll of thermoplastic is not applied to the metalized first sheet roll. In these embodiments the metal may be left unprotected, or a protective coating or coatings, such as silicon monoxide or other standard barrier coatings, may be adhered to the surface. Methods for coating such metal layers are known in the art and will not be discussed herein. As discussed above, it may be desirable to leave regions close to the center of the roll uncoated for the purposes of making electrical connections.

E. Cutting and Adjustment of the Resistive Patterns

Once the metallized first roll is affixed to the second, protective roll (or coated with a protective barrier) the metal/thermoplastic composite "sandwich" is cut into a desired resistance pattern. First, a portion of the composite (e.g., the outer portions of the rolled thermoplastic sheet) may be cut away to increase the uniformity of the deposition on the remaining portions. Second, the remaining composite is rough-cut into desired shapes. Finally, each such shape is physically trimmed or otherwise treated to increase its resistance as desired to meet a specified standard.

1. Methods for Rough-Cutting the Resistive Patterns

Methods for cutting a thermoplastic film are generally known in the art. For example, for large RTDs (e.g., a 60" or 12" roll) die cutting or other blade cutting may be used; for smaller rolls (e.g., 1") laser cutting or water cutting may be used. Such techniques are known and will not be discussed herein. Generally, any method of cutting that does not destroy the thermoplastic (e.g., by elevating the temperature of the sandwich to greater than that allowed for the thermoplastic film) may be used. As discussed above, when cutting the resistive patterns, it is possible to have the terminal points of the pattern located in an uncovered region of the metallized film. However, it is generally desirable to environmentally isolate the conductive film and the terminal points.

2. Geometry of the Resistive Patterns

Figure 6B:
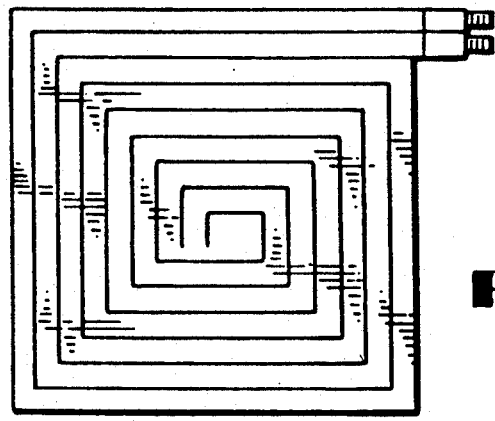

Resistive patterns for thin and thick films are known in the art and will not be discussed in detail. These patterns may include rectangles, circles, other basic geometric shapes, and serpentine patterns. Examples of such patterns are the well known bar, top-hat, loop, and ladder patterns. FIGS. 6A and 6B are provided as examples of such patterns. In FIG. 6A a square spiral pattern 60 is shown, while a rectangular pattern 62 is illustrated in FIG. 6B. Generally, the resistance of the RTD is proportional to the overall area (in square units) between the two terminal points. Methods for computing the resistance of a pattern resister, given the ohms/square value for the material, and the geometry of the pattern, are known.

As illustrated in both 6A and 6B a calibration strip, may be provided. As discussed below, this calibration strip may be used to "fine tune" or calibrate the RTD to a desired resistance at a certain temperature.

One unique advantage of this invention over the prior art is that the material comprising the RTD is flexible. This allows the resistive patterns to be cut to virtually any geometry and to be customized to specific applications. For example, a spiral-square or other pattern may allow the resistive element to conform to the shape of a particular object, e.g., an air duct. Resistive patterns may be designed and customized to meet the requirements of any number of specific applications.

F. Heat Treatment

Figure 7:
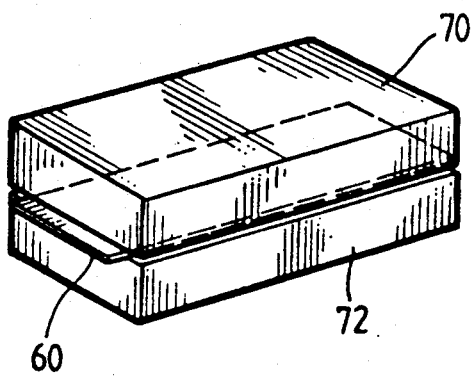
FIG. 7, illustrates the heating of a resistive pattern.

After being cut from the thermoplastic/metal sandwich, the resistive patterns are then heated to a temperature slightly above the expected operating temperature (e.g., approximately 180 C. for MYLAR) and left at this temperature for approximately 1 hour. This process is illustrated in FIG. 7. As FIG. 7 shows, two metal plates 70, 72, may be used during this heating, or annealing, to compress the resistive patterns and prevent these patterns from distorting. This annealing step is sometimes necessary to improve the dimensional stability of the RTD over temperature cycles.

This annealing step may be omitted if heat stabilized materials are used.

G. Attachment of Connectors

After the resistive pattern has been heat treated or annealed, electrical connectors are attached. Alternate methods for affixing the connectors to the resistive patterns are shown in FIGS. 8A–8D, 8E-1, 8E-2 and 8E-3.

1. Conventional Connectors

Figure 8A:
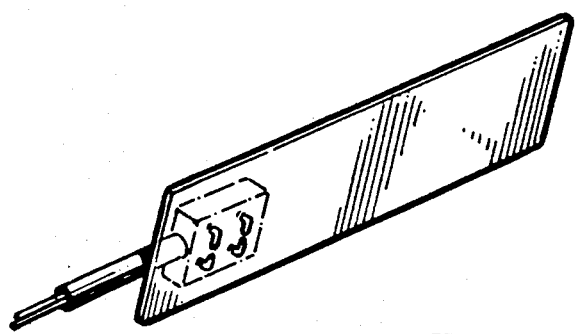

As FIG. 8a illustrates, connections to the resistive pattern may be made by a conventional connector, such as those currently available from the AMP company of Harrisburg, Pa. These connectors, much like staples, may be affixed to the terminal ends of the resistive pattern as shown.

Figure 8B:

Because the metal layer is extremely thin, it is often difficult to make a good electrical connection to the connector. Further, the combined metal and thermoplastic layer thickness is so thin that the connector may not be able to "grab" enough of the resistive element to hold the device. One possible method of overcoming this problem is to add a backing 82 to the terminal ends of the resistive elements 60, as illustrated in FIG. 8B. An additional backing of approximately 7 mils has been found sufficient for purposes of making the connector attachment. In addition to the backing, a layer of conductive epoxy 84 may be applied to the exposed metal surface of the resistive element. This exposed surface provides a larger area over which electrical contact may be made. These alternatives are illustrated in FIG. 8b with the conductive epoxy illustrated on top of the exposed region of sheet, and the backup illustrated directly underneath.

2. Alternate Embodiments

Figure 8C:
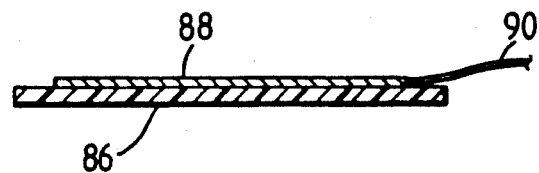
Figure 8D:
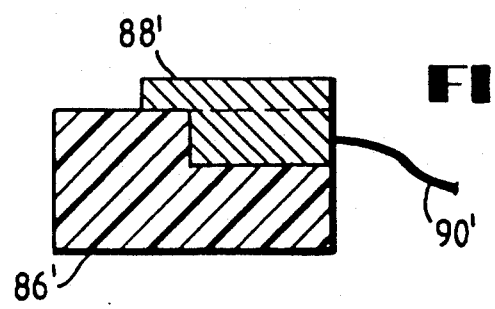

A second method for attaching a connector to the resistive pattern is illustrated in FIGS. 8C–8E. In order to effect this alternate connection, an interconnect board must first be selected that can meet the temperature extremes established for the RTD (e.g., a board comprising an injected molded polyester resin). The interconnect board may be matched to the thermoplastic material used in the RTD (i.e., may be made of the same material). Such a board is illustrated as 86 in FIG. 8C. This board is then patterned, or etched to a pattern, of approximately 4 mils. Several conductive traces 88 are then attached to the board via conventional plating techniques or adhesion. The number of traces depends on the number of connections to be made to the RTD. Electrical leads 90 are attached to the conductive traces or strips.

One alternative to the aforementioned interconnect board is to use a molded 3-D interconnect, as illustrated in FIG. 8B. These devices are currently known in the art and include elements which correspond to those discussed above with reference to the PC board. Like elements have been given like reference numbers. The molded 3-D interconnects generally include one or more conductive strips 88', usually copper, an insulating base 86', and electrical leads 90'. The following discussion applies to both the prepared PC board and the 3-D molded interconnect.

An illustration of the complete connector, as well as the steps followed in constructing the connector, is shown in FIGS. 8E-1, 8E-2 and 8E-3.

A first sheet of thermoplastic polymer 92 is attached to the base of the connector via adhesive or mechanical rivets. This sheet should be attached to the base 86 such that the conductive strip 88 and the thermoplastic sheet 92 form a substantially planer interconnect surface 94. The thermoplastic sheet 92 with the connector attached is then placed into a vacuum deposition chamber or the like and a thick film buildup 96, of between 10,000–20,000 angstroms, is deposited at the junction between the copper conductor 88 and the thermoplastic sheet 92. Shadow mask tooling or photolithography may be used to ensure that the conductive material is applied to or remaining on only the junction region.

Because different materials all come together at the junction region, and that region may be thermally cycled, it is important to ensure that a conductive path always exists across the junction region. The thick buildup of aluminum 96 provides such a conductive path. Once the thick deposition of metal is applied the connector-thermoplastic sheet provides a planerized interconnect area with the leads already connected.

After the shadow mask is removed (if shadow mask tooling is used) and a sputter etch is performed to remove oxides, the thermoplastic sheet with the connector may be placed into a vacuum deposition chamber, and a thin layer of metal 96 (approx. 250–1000 angstroms) may deposited onto it as discussed above. A protective coat (e.g., silicon monoxide) may be applied to the thin metal layer 96 prior to removal from the vacuum deposition chamber. Such a protective coat may inhibit the oxidation of metal layer 96.

Following the above described procedures a second, protective, sheet of thermoplastic 98 may be applied to the metallized sheet and the resistive patterns may be cut out. The only significant difference between this embodiment and the ones previously described is that in this embodiment the connectors are attached to the first thermoplastic sheet throughout the process.

In several of the connection configurations discussed above, the exposed metal region is left exposed after the connector is attached to the thermoplastic sheet. This may leave the exposed region vulnerable to corrosion, erosion, or scratching. To inhibit such damage, a barrier coat may be applied to the exposed surface after the connector is attached to the thermoplastic sheet.

H. Calibration

Once the connectors are applied to the resistive pattern (or in the alternate embodiment, once the resistive patterns have been heat treated) the resistive elements must be calibrated. Calibration is necessary because of the percent variation that is inherent is several of the previous processing steps.

Generally, it is desirable to have the resistive patterns calibrated such that the resistance is defined at 0 degrees C. (e.g., 100 ohms at 0 degrees C., 250 ohms at 0 degrees C.). Because the RT curve of the RTD of this invention may be determined, it is possible to calibrate the devices at temperatures other than 0 degrees C. FIGS. 9A-1, 9A-2, 9B-1 and 9B-2 illustrate such a calibration technique.

Figures 1, 9A:
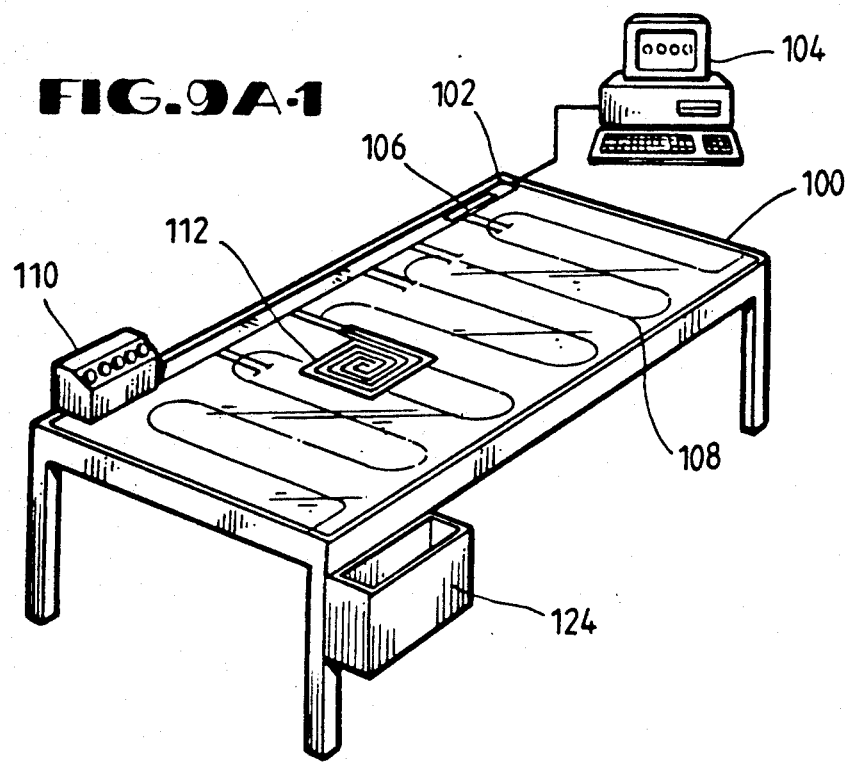

As illustrated in FIG. 9A, a table having a glass top 100 is provided with a connection strip 102 attached to a personal computer 104. Alternatively, a comparator board may be used in place of personal computer 104. The connection strip 102 contains several leads 103 that may be attached to the electrical leads of the RTD's to be calibrated. Within the connection strip 102 is provided a RTD 106 that has already been calibrated. A heater 108 is provided to heat the glass top 100 to approximately 100 F. The glass top 100 table is heated so that the RTDs to be calibrated and the pre-calibrated standard are at substantially the same temperature.

A switch on the connection strip 110 allows the one performing the calibration to select which of the uncalibrated RTDs is to be measured. The personal computer 104 is attached to conventional circuitry which measures the resistive value of the uncalibrated RTD 112 and that of the calibrated RTD 106. A visual indication is provided to indicate the difference between the two devices.

Figures 1, 9B:
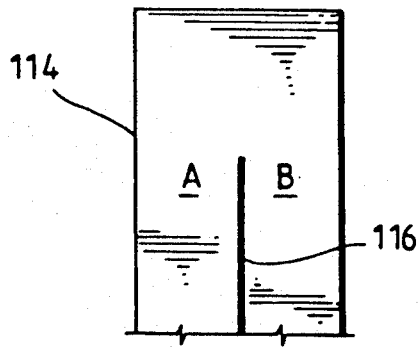
Figures 2, 9B:
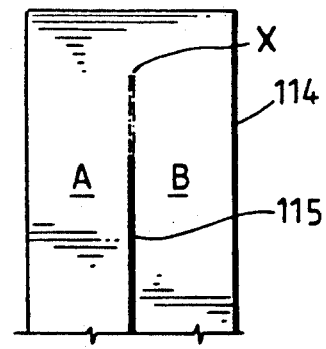

As discussed above, a calibration strip 114 may be designed into the RTD. This calibration strip 114 is illustrated in FIGS. 9B-1 and 9B-2. As discussed above, the resistive value of the RTD depends on the area (in square units) that is between the terminal points of the resistive element. By carefully cutting along the slit 116, the area between point A and point B may be increased.

For example, in FIG. 9B1 the area between point A and point B is about 1 square unit of area. After extending the slit to point X, there are four square units between the points. This is illustrated in FIG. 9B2. By designing the original pattern of the resistive element such that its resistance will be slightly less than desired, the above describe calibration method may be followed to increase the resistive value to precisely the right amount.

One method for extending the slit 116 is illustrated in FIGS. 9A-2 and 9B-1. In this method a slotted cover 120 is provided that may be used to cover the resistive element being calibrated. A cutting razor 122 is then inserted through the slot. The slotted cover 120 is necessary to prevent the heat from the individual performing the calibration from affecting the temperature of the device being calibrated.

Once the RTD to be calibrated is covered and the razor positioned at calibration slit 116, the person performing the calibration begins to extend the slit with by cutting with the razor 120, while watching the output from personal computer 104. When the personal computer 104 indicates that the resistive value of the known RTD and that being calibrated are sufficiently close, the operator stops extending the slit, and removes the cover. As illustrated in FIG. 9A, an ice bath 124 may be provided for use as a reference standard. The use of an ice bath in calibrating RTD's is discussed in ASTM publication No. E-644.

Other methods of calibration, such as cutting off a portion of the resistive element to decrease the area, may be used.

Once calibrated, the resistance of the RTD may be measured using known electronic devices. These electronic devices may be configured to produce an industry standard 4-20 miliamp output using the RTD of the present invention.

I. Applications of the Present Invention

1. Temperature Integrating

Once manufactured and calibrated, the RTD of the present invention has several applications. Perhaps one of the most important application made possible by the present invention is that of large scale temperature integrating. Temperature integrating involves the determination of the integrated temperature of a large single object (e.g., a large wall), or of a particular region of material (e.g., water flowing through a pipe). The integrated temperature of such objects or regions is often useful for making engineering decisions, for process control, and for basic temperature detection. In the past, large scale temperature integration was difficult to inconvenient. To approximate such integration, temperature averaging was generally done through the use of numerous temperature sensors whose outputs had to averaged by other expensive and complex apparatus.

The RTD of the present invention allows temperature integrating to be accomplished economically and effectively. FIG. 10A illustrates one method of using the present invention to measure the integrated temperature of a large wall. Basically, a large RTD 130 is manufactured and affixed to the wall 132. For purposes of illustration a square spiral pattern is used although others are possible. This large RTD 130 may be adhered to the wall (if the measurements are to be permanently taken), or held in place by non-permanent connectors (e.g., tape, tacks, etc.). Because a single RTD covers the entire wall, and because of the quick response time of the present invention, the RTD will quickly yield an indication the integrated wall temperature. Of special import in the present invention is the fact that the RTD 130 can, because it is flexible, be folded into a compact package once the wall temperature is measured. Further, because of the flexible nature of the invention, a "RTD shell" can be produced which could conform to the shape of the object whose integrated temperature is desired to be determined.

It is envisioned that RTD of the type shown in FIG. 10A may be embedded within a wall, airplane wings, or other objects to constantly measure the average temperature of those devices. FIG. 10B illustrates a portion of pipe that can measure the integrated temperature of the fluid flowing therethrough. A long, rectangular, RTD 134 is coiled and affixed to the inside of the pipe 136. As the fluid passes through the pipe, it will cause a change in the resistance of the RTD. The new resistance can be measured, and the integrated temperature of the fluid may thereby be determined with reasonable accuracy and precision. In this manner the temperature of large fluid containers, such as the storage areas of shipping tankers, may be measured.

A still further embodiment of the present invention is illustrated in FIG. 10C. In that figure a flexible RTD 140 of the present invention is designed and patterned so as to conform to the shape of a particular motor 142. Alternate embodiments are envisioned wherein the thermoplastic sheets used in manufacturing the RTD 140 comprise so-called shrink wrap material, and the RTD 140 is "shrink-wrapped" (e.g., thermally conformed) around the motor 142. This particular embodiment allows the heat of the motor to be effectively monitored during operation. A quick rise in temperature or a gradual rise to a high temperature could provide a fast indication of improper motor operation.

2. Combined Fluid Level and Temperature Measurement

FIGS. 11A, 11B-1 and 11B-2 illustrate a novel fluid level and temperature measuring device that is made possible by the present invention. FIG. 11A illustrates one embodiment of this device.

A first RTD 150 is applied along the walls of a large fluid container, e.g., the cargo area of a shipping vessel. As discussed above, this RTD may be used to measure the integrated temperature of the walls of the container. Although illustrated as covering only one wall, RTD may be designed to cover substantially all of the container.

Several other RTDs 152 are positioned so as to run horizontally along the wall. These RTDs 152 are used to determine the level of the fluid in the container.

In most instances the thermal conductivity of a substance in fluid form is generally much greater than the thermal conductivity of that same substance in gaseous form. As such, when heat is added to a system having a substance that is both gaseous and fluid, the temperature of thermally conductive materials in contact with the fluid will change at a rate substantially different from materials in contact with the gas. The invention of FIG. 11a makes use of the difference in conductivity to determine the fluid level in the container.

As shown in FIG. 11D, RTDs 152a and 152b consistently monitor the temperature of the walls of the container. RTD 152a will provide an indication as to the general temperature of the gas/wall interface; RTD 152b provides an indication as to the temperature of the fluid/wall interface. Thus, from RTD 152a the gas/wall temperature Tg may be measured, while RTD 152b yields the fluid/wall temperature Tf.

RTD 155, of known length L, is positioned vertically in the container such that its length runs from the bottom of the container to the top. From the resistance of RTD 155, the temperature measured by that device may be calculated Trtd.

Given the wall temperature in contact with the gas, Tg, the wall temperature in contact with the fluid, Tf, and the measured temperature, Trtd, the level of the fluid may be determined by a ratio of the resistance values.

Alternate embodiments are envisoned where a heating element is provided to add heat to the system for brief periods of time. During the time the heating element is activated, the change in the temperature of each RTD can be measured and compared as discussed above.

FIG. 11B-1 illustrates an alternate embodiment of fluid level and temperature device. A single RTD 155 is positioned vertically in a container 160 which is capable of receiving fluid 162. In order to determine the level of a particular fluid 162, the RTD 155 should first be calibrated. This is done by measuring the RTD's 155 resistance when the container 160 is empty, i.e., R0, and when the container 160 is filled with the fluid to be monitored at a known level KL, i.e., R1. Knowing that the TCR of the RTD 155 is substantially constant, the proportional relationship between resistance measured to fluid level can be calculated. A basic method for performing such a calculation is to compute the quantity $L_?aKL/(R_1-R_0)$.

Once the RTD is calibrated, the level of the fluid may be measured by taking the resistance value that is measured, and multiplying it by the proportionality constant determined when the device was calibrated.

An alternate embodiment to the device of FIG. 11B is illustrated in FIG. 11C. This device operates similar to that describe above in respect to FIG. 11B, but the RTD 155 covers several sides of the container.

Figure 12:
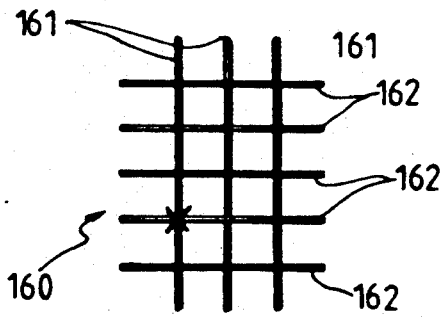
FIG. 12 illustrates a web of temperature sensors in accordance with the present invention.

As still further embodiment of the present invention is shown in FIG. 12. In that figure a web of RTDs 160 is shown. Web 160 comprises vertical strips 161, as well as horizontal strips 162. By monitoring the temperatures of all of the RTD's, it may be possible to pinpoint the location of a rise (or fall) in temperature. For example, if a temperature rise occurs at point X, both RTD 161' and 162' will show a rise in temperature. By comparing the temperatures of the RTD's comprising web 160, the precise location of a temperature disturbance may be located. Such information may be particularity important when the location of a dangerous temperature disturbance (e.g., a fire in a hotel) need to be known.

Figure 13:
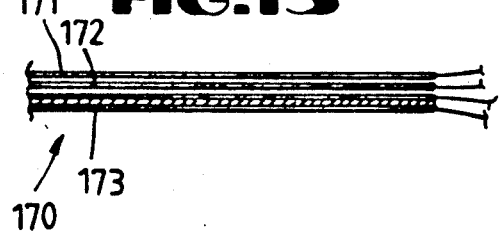
FIG. 13 illustrates a multilayer sensor in accordance with the present invention.

A still further embodiment of the invention is illustrated in FIG. 13. There, a multilayer RTD 170 is shown. RTD 170 comprises several RTD's, 171, 172 of the type discussed above. A thin metallic film 173 is also provided. The RTDs 171 and 172 should be selected such that the thermoplastic material of RTD 171 will breakdown at a lower temperature than that of 172.

By having RTD's 171, 172 of different temperature ranges, a sensor is created whereby the degree of a temperature disturbance may be monitored and determined. For example, a rise in temperature up to a certain level may cause RTD 171 to break (e.g., separate). Such a break would yield an infinite resistance for that RTD. This could set off one alarm indicating that some action should be taken (e.g., RTD 172 should be closely monitored.)

Because the temperature range of RTD 172 is greater than that of RTD 171, the temperature of the system being monitored can still be measured. Then, by progressively stacking RTDs of different temperature ranges, a sensor may be produced whereby various alarm signals are provided depending on the degree of temperature rise.

Conductive film 173 is provided so that a complete break of the RTD may be measured. For example, a break of all the RTD's as well as film 173 may indicate that the sensor has been inadvertently severed as opposed to actually destroyed by a temperature disturbance.

The foregoing embodiments are presented to illustrate but not to limit the invention, which is particularly pointed out in the following claims.

What is claimed is:

1. An electrical connector for making electrical contact with a thin conductive film, the connector comprising:
    (a) an insulating base;
    (b) an electrically conductive strip attached to the base, the conductive strip having an exposed surface and an attached surface, the attached surface being attached to the base;
    (c) an electrical lead attached to the conductive strip; and
    (d) a flexible substrate of polymer attached to the base and abutting the conductive strip, the flexible substrate having an attached surface attached to the base and an exposed surface, such that the exposed surface of the conductive strip and the exposed surface of the substrate form a substantially planar surface.

2. The connector of claim 1 further including a buildup of conductive material at the junction of the exposed surfaces of the conductive strip and the substrate.

3. A method for electrically connecting a thin conductive film to an electrical lead comprising the steps of:
    (a) affixing a highly conductive strip to an insulating base, the conductive strips having an attached surface attached to the base, and an exposed surface;
    (b) affixing an electrical lead to the highly conductive strip;
    (c) affixing a flexible substrate of polymer to the base, the flexible substrate having an attached surface attached to the base and an exposed surface, such that the exposed surfaces of the conductive strip and the flexible substrate form a substantially planar surface;
    (d) affixing a thin conductive film to the substantially planar surface such that the thin conductive film covers a portion of the conductive strip.

4. The method of claim 3 wherein a buildup of conductive material is affixed at the junction of the exposed surfaces of the conductive strip and the substrate before performing step (d) and the thin conductive film is affixed to the substantially planar surface such that is in contact with the buildup of conductive material.

5. The method of claim 3 where the thin conductive film is attached to the substantially planar surface using vacuum deposition.

6. A method for electrically coupling a thin conductive film with an electrical lead, comprising the steps of:
    (a) providing an electrical connector having an insulating base, a highly conductive strip having an upper surface affixed to a portion of the insulating base, and an electrical lead attached to the strip;
    (b) attaching a thin substrate of flexible polymer to the insulating base such that the upper surface of the conductive strip and the unattached surface of the flexible substrate form a substantially planar surface;
    (c) depositing a thin conductive film on the substantially planar surface such that it covers a portion of the upper surface of the conductive strip.

7. The method of claim 6 where the thin conductive film is deposited through vacuum deposition.

* * * * *